(12) United States Patent
Nakamura et al.

(10) Patent No.: US 8,866,157 B2
(45) Date of Patent: Oct. 21, 2014

(54) SEMICONDUCTOR DEVICE AND METHOD OF FABRICATING THE SEMICONDUCTOR DEVICE

(71) Applicant: Fujitsu Limited, Kawasaki (JP)

(72) Inventors: Norikazu Nakamura, Sagamihara (JP);
Shirou Ozaki, Yamato (JP); Masayuki Takeda, Atsugi (JP); Toyoo Miyajima, Isehara (JP); Toshihiro Ohki, Hadano (JP); Masahito Kanamura, Isehara (JP); Kenji Imanishi, Atsugi (JP); Toshihide Kikkawa, Machida (JP); Keiji Watanabe, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/900,904

(22) Filed: May 23, 2013

(65) Prior Publication Data

US 2013/0256690 A1    Oct. 3, 2013

Related U.S. Application Data

(63) Continuation of application No. PCT/JP2010/071172, filed on Nov. 26, 2010.

(51) Int. Cl.

| | | |
|---|---|---|
| *H01L 29/15* | (2006.01) | |
| *H01L 21/00* | (2006.01) | |
| *H01L 31/0312* | (2006.01) | |
| *H01L 21/28* | (2006.01) | |
| *H01L 29/20* | (2006.01) | |
| *H01L 29/78* | (2006.01) | |
| *H01L 29/66* | (2006.01) | |
| *H01L 29/778* | (2006.01) | |
| *H01L 29/51* | (2006.01) | |
| *H01L 29/417* | (2006.01) | |
| *H01L 23/31* | (2006.01) | |
| *H01L 29/423* | (2006.01) | |

(52) U.S. Cl.
CPC ...... *H01L 21/28264* (2013.01); *H01L 29/2003* (2013.01); *H01L 29/78* (2013.01); *H01L 29/517* (2013.01); *H01L 29/66462* (2013.01); *H01L 2924/0002* (2013.01); *H01L 29/41766* (2013.01); *H01L 29/7787* (2013.01); *H01L 23/3171* (2013.01); *H01L 29/4236* (2013.01)
USPC ............................................ 257/77; 438/105

(58) Field of Classification Search
CPC ............... H01L 21/28254; H01L 29/7787; H01L 21/28264; H01L 29/2003; H01L 29/517; H01L 29/66462
USPC ............................................ 257/77; 438/105
See application file for complete search history.

(56) References Cited

U.S. PATENT DOCUMENTS

| | | |
|---|---|---|
| 2008/0067546 A1 | 3/2008 | Murata et al. |
| 2008/0272491 A1 | 11/2008 | Itani |

(Continued)

FOREIGN PATENT DOCUMENTS

| | | |
|---|---|---|
| JP | 2008-103408 | 5/2008 |
| JP | 2008-103705 | 5/2008 |

(Continued)

OTHER PUBLICATIONS

International Search Report, mailed in connection with PCT/JP2010/071172 and mailed Mar. 1, 2011.

*Primary Examiner* — William D Coleman
(74) *Attorney, Agent, or Firm* — Fujitsu Patent Center

(57) ABSTRACT

A semiconductor device may include a first semiconductor layer formed on a substrate, a second semiconductor layer formed on the first semiconductor layer, a source electrode and a drain electrode in contact with the first semiconductor layer or the second semiconductor layer, an opening formed in the second semiconductor layer, an insulating film formed on an inner surface of the opening formed in the second semiconductor layer and above the second semiconductor layer, a gate electrode formed in the opening via the insulating film, and a protective film formed on the insulating film and including an amorphous film containing carbon as a major component.

20 Claims, 8 Drawing Sheets

(56) References Cited

U.S. PATENT DOCUMENTS

2009/0252863 A1 10/2009 Yoshizawa
2010/0090250 A1 4/2010 Murata et al.
2010/0159656 A1 6/2010 Nakata et al.
2012/0205663 A1* 8/2012 Nakamura et al. .............. 257/76

FOREIGN PATENT DOCUMENTS

| JP | 2008-211028 | 9/2008 |
| JP | 2009-054807 | 3/2009 |
| JP | 2010-166040 | 7/2010 |
| WO | WO-2007/010736 | 1/2007 |

* cited by examiner

SEMICONDUCTOR DEVICE AND METHOD OF FABRICATING THE SEMICONDUCTOR DEVICE

CROSS-REFERENCE TO RELATED APPLICATIONS

The present application is a U.S. continuation application filed under 35 USC 111(a) claiming benefit of priority under 35 U.S.C. 120 and 365(c) of PCT International Application No. PCT/JP2010/071172 filed on Nov. 26, 2010, the entire contents of which are incorporated herein by reference.

FIELD

The embodiments discussed herein are related to a semiconductor device and a method of fabricating the semiconductor device.

BACKGROUND

A field-effect transistor may include a gallium nitride (GaN) electron channel layer using an aluminum gallium nitride/gallium nitride (AlGaN/GaN) heterojunction. GaN is a material having a relatively wide band gap, high breakdown voltage, and high saturated electron velocity. Hence, GaN is a promising material for forming a semiconductor device that implements high current, high withstand voltage, and low on-resistance operation. Therefore, numerous studies are being conducted on the development of semiconductor devices having GaN based materials including the field-effect transistor having a GaN electron channel layer for next generation high-efficient switching devices that may be able to save power in an amount exceeding the limits of silicon power devices.

In semiconductor devices such as the field-effect transistor, an insulating film may generally be formed on an entire surface of the field-effect transistor or the like due to passivation or the like after a gate electrode or a drain electrode has been formed.

RELATED ART DOCUMENTS

Patent Document

Patent Document 1: Japanese Laid-open Patent Publication No. 2008-103408

In order to implement a highly-efficient power switching device having a transistor, the reduction in on-resistance, the implementation of a normally-off operation, and the increase in a withstand voltage of the switching device may be required. The switching device may, though differing in application purposes, generally require a withstand voltage of several hundred to several kV, and it may be difficult to increase a withstand voltage of the switching device having a Schottky gate structure. In order to overcome the above difficulty, there is proposed a switching device having a structure for reducing a gate leakage current to increase a withstand voltage by forming an insulating film between a gate electrode and a semiconductor layer.

In the transistor of such a switching device having the insulating film formed between the gate electrode and the semiconductor layer, an insulating film is formed as a protection film for passivation. However, the withstand voltage may be lowered in the transistor by forming the protection film. Hence, the transistor may have an insufficient withstand voltage.

Accordingly, it may be desired to provide a semiconductor device such as a transistor having the insulating film formed between the gate electrode and the semiconductor layer that exhibits a sufficient withstand voltage even if the semiconductor device has an insulating film as a protective film. In addition, it may be desired to provide a method of fabricating such a semiconductor device.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

Other objects, features, and advantages of the present invention will become more apparent from the following detailed description when read in conjunction with the accompanying drawings.

SUMMARY

According to one aspect of the present invention, a semiconductor device may include a first semiconductor layer formed on a substrate; a second semiconductor layer formed on the first semiconductor layer; a source electrode and a drain electrode in contact with the first semiconductor layer or the second semiconductor layer; an opening formed in the second semiconductor layer; an insulating film formed on an inner surface of the opening formed in the second semiconductor layer and above the second semiconductor layer; a gate electrode formed in the opening via the insulating film; and a protective film formed on the insulating film and including an amorphous film containing carbon as a major component.

DESCRIPTION OF EMBODIMENTS

Figure 1:
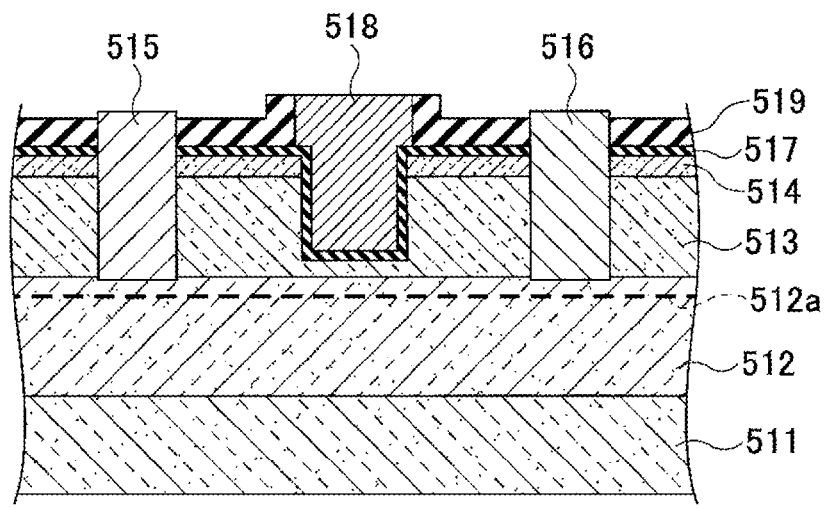
FIG. 1 is a cross sectional view illustrating a structure of a field-effect transistor formed with a protection film.

Preferred embodiments of the present invention will be described with reference to the accompanying drawings. In the following description, those parts that are the same are designated by the same reference numerals, and a description thereof will be omitted.

First Embodiment

Initially, a description will be given of a transistor having an insulating film formed between a gate electrode and a semiconductor layer. More specifically, a description will be given of a transistor having an insulating film between a gate electrode and a semiconductor layer, in which an insulating film may be formed as a protective film. As illustrated in FIG. 1, the transistor having the above structure may be called a high electron mobility transistor (HEMT). The HEMT may include an electron channel layer 512, an electron supply layer 513, and a cap layer 514 that are epitaxially grown on a substrate 511 in a layered manner. Note that in the above structure, a two-dimensional electron gas (2DEG) 512a may be formed in the electron channel layer 512 in the vicinity of an interface between the electron channel layer 512 and the electron supply layer 513. Further, a source electrode 515 and a drain electrode 516 may be formed within openings formed by eliminating respective parts of a cap layer 514 and the electron supply layer 513 such that the source electrode 515 and the drain electrode 516 are electrically connected to the electron channel layer 512. Further, a gate electrode 518 may be formed via an insulating film 517 within an opening that is formed by eliminating respective parts of the cap layer 514 and the electron supply layer 513. Note that the insulating film 517 may also be formed on the cap layer 514, and a protective film 519 may be formed on the insulating film 517.

The substrate 511 may be formed of a silicon carbide (SiC) substrate or a sapphire ($Al_2O_3$) substrate. The electron channel layer 512 may be made of intrinsic GaN (i-GaN). The electron supply layer 513 may be made of n-type aluminum gallium nitride (n-AlGaN). The cap layer 514 may be made of n-type gallium nitride (n-GaN). In addition, the source electrode 515, the drain electrode 516, and the gate electrode 518 may be formed of metallic materials, and the insulating film 517 may be formed by a plasma atomic layer deposition (ALD) that deposits an aluminum oxide ($Al_2O_3$) film. In addition, the protective film 519 may be formed of a silicon nitride film. However, in view of improving throughput and the like in general, a plasma chemical vapor deposition (CVD) that exhibits higher deposition rates may frequently be utilized for forming the protective film 519.

Note that the transistor having the structure formed with the protective film 519 may tend to exhibit a drastically lowered withstand voltage compared to the transistor having the structure not formed with the protective film 519. That is, the formation of the protective film 519 may lower the withstand voltage of the transistor, which may result in degraded characteristics of the transistor.

As described earlier, various factors for the increase in gate leakage current may be given as follows. For example, a silicon nitride film serving as the protective film 519 may be deposited by the plasma CVD. However, a metal-rich layer may be formed in an interface of the aluminum oxide film serving as the insulating film 517 due to the reduction of a hydrogen gas generated as a by-product of the reaction from depositing gases. This may lower a withstand voltage. Further, the protective film 519 is deposited by the plasma CVD. Hence, when the protective film 519 is deposited, the surface of the insulating film 517 may be damaged by plasma, which may induce an oxygen deficit or the like to lower the withstand voltage.

Note that a withstand voltage may be lowered in a two-layered film having a silicon oxide film and a silicon nitride film that is formed as the protective film 519.

Structure of Semiconductor Device

Figure 2:
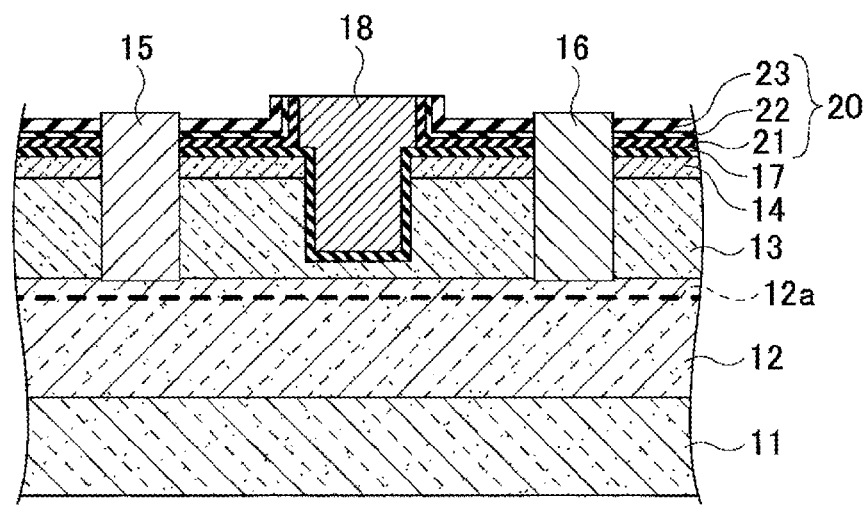
FIG. 2 is a cross sectional view illustrating a structure of a semiconductor device in a first embodiment.

Next, a semiconductor device in a first embodiment is described. FIG. 2 illustrates a structure of the semiconductor device in the first embodiment. As illustrated in FIG. 2, the semiconductor device in the first embodiment may be called a high electron mobility transistor (HEMT). The HEMT may include an electron channel layer 12, an electron supply layer 13, and a cap layer 14 that are epitaxially grown on a substrate 11 formed of a semiconductor and the like in a layered manner. Further, a source electrode 15 and a drain electrode 16 may be connected to the electron channel layer 12, and a gate electrode 18 may be formed via an insulating film 17 within an opening that is formed by eliminating parts of the cap layer 14 and the electron supply layer 13. Note that the insulating film 17 may be formed on the cap layer 14, and a first insulating protective film 21, an amorphous carbon film 22, and a second insulating protective film 23 may be formed as a protective film 20 on the insulating film 17.

The substrate 11 may be formed a silicon carbide (SiC) substrate, a sapphire ($Al_2O_3$) substrate, or the like. The electron channel layer 12 serving as a first semiconductor layer may be made of i-GaN, the electron supply layer 13 serving as a second semiconductor layer may be made of n-AlGaN, and the cap layer 14 serving as a third semiconductor layer may be made of n-GaN. Note that this structure may form a two-dimensional electron gas (2DEG) 12a in an interface of the electron channel layer 12 between the electron channel layer 12 and the electron supply layer 13 in the vicinity of the electron supply layer 13. In addition, the source electrode 15, the drain electrode 16, and the gate electrode 18 may be formed of metallic materials, and the insulating film 17 may be formed by a plasma atomic layer deposition (ALD) that deposits an aluminum oxide ($Al_2O_3$) film. Further, the first insulating protective film 21 may be formed of an aluminum oxide film, and the second insulating protective film 23 may be formed of a silicon nitride (SiN) film.

The amorphous carbon film 22 may, as described later, be an amorphous film having carbon as a major component, and may also be called diamond like carbon (DLC). The amorphous carbon film 22 may be an insulating film having high density, an excellent hydrogen barrier property, a high insulating property, and high surface smoothness. In order to acquire a high insulating property and high density, the hydrogen content of the amorphous carbon film 22 may preferably be reduced to the minimum such that the amorphous carbon film 22 forms a diamond like carbon (DLC) structure. That is, the amorphous carbon film 22 may preferably have high density and a significant fraction of sp3 bonds in carbon-carbon bonding.

The amorphous carbon film containing hydrogen and capable of being deposited by CVD may have the highest film density of approximately 2.6 g/cm$^3$, and a diamond has the density of 3.56 g/cm$^3$. Hence, a preferable density of the amorphous carbon film 22 may be 2.7 g/cm$^3$ or higher and 3.56 g/cm or lower. Note that the density of the film may be computed based on a result obtained by Rutherford backscattering spectrometry performed on an amorphous carbon film deposited on a silicon substrate, and the thickness in a cross sectional length measurement of the film obtained by a transmission electron microscope (TEM). Further, a bonding scheme of the carbon-carbon bonding in carbon includes sp2 bonding and sp3 bonding. Graphite is formed of sp2 bonds and a diamond is formed of sp3 bonds. Hence, in order to allow the amorphous carbon film to approach a diamond like carbon, it may be preferable that the amorphous carbon film have sp3 bonds more than sp2 bonds. That is, it may be preferable that the carbon-carbon bonding have sp2≤sp3.

Such an amorphous carbon film may be formed by the later-described filtered cathodic arc (FCA) deposition. Note that the density of the amorphous carbon film deposited by the FCA may be 3.2 g/cm$^3$.

In addition, the thickness of the deposited amorphous carbon film may preferably be 1 nm or more and 30 nm or less. In order to cover an entire surface of the semiconductor device with the amorphous carbon film, a thickness of at least several atomic layers may be required. Hence, it may be insufficient to cover the entire surface of the semiconductor device with the amorphous carbon film having the thickness of 1 nm or less. Further, the stress of the amorphous carbon film tends to be large. Hence, when the thickness of the amorphous carbon film is increased, the amorphous carbon film may come off due to the stress. Note that it may be known in the art that when the amorphous carbon film is formed to have the thickness of 30 nm or less, the amorphous carbon film may be unlikely to come off. Therefore, the thickness of the amorphous carbon film may preferably be 30 nm or less, because the amorphous carbon film having the thickness of 30 nm or less may be unlikely to come off.

In the semiconductor device according to the first embodiment, even when a silicon nitride (SiN) film is formed as the second insulating protective film 23 by the plasma CVD, little plasma damage may affect the insulating film 17 by forming the amorphous carbon film 22. In addition, in the semiconductor device according to the first embodiment, a gas containing a hydrogen component will not be used for forming the amorphous carbon film 21. Hence, an aluminum oxide film of a surface of the insulating film 17 will not be reduced with hydrogen, which may inhibit a metal-rich layer from being formed on the surface of the insulating film 17. With the above-described factors, the withstand voltage may be increased.

Method of Fabricating Semiconductor Device

Next, a method of fabricating a semiconductor device in the first embodiment is described with reference to FIGS. 3A to 3C, and FIGS. 4A to 4C.

Figure 3A:
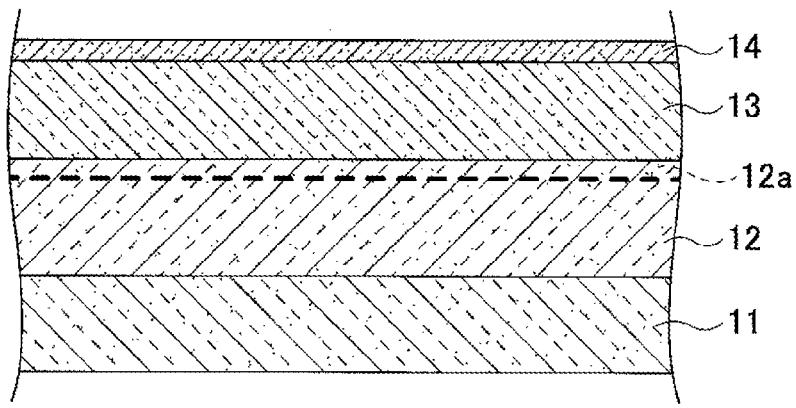
FIGS. 3A to 3C are cross sectional views illustrating a first fabrication process of the semiconductor device in the first embodiment.

As illustrated in FIG. 3A, a not-illustrated nucleation layer may be formed on a substrate 11, and semiconductor layers including an electron channel layer 12, an electron supply layer 13, a cap layer 14, and the like may epitaxially be grown on the substrate 11 by metal-organic vapor phase epitaxy (MOVPE) or the like, thereby forming the semiconductor device.

The substrate 11 may be formed of a silicon carbide (SiC) substrate or a sapphire ($Al_2O_3$) substrate. The not-illustrated nucleation layer may be formed of undoped i-Aln having a thickness of 0.1 μm, for example. The electron channel layer 12 may be formed of i-GaN having a thickness of 3.0 μm, and the electron supply layer 13 may be formed of n-$Al_{0.25}Ga_{0.75}N$ having a thickness of 20 nm. Further, the cap layer 14 may be formed of n-GaN having a thickness of 5 nm. Note that the semiconductor layers may be crystal-grown by molecular beam epitaxy (MBE) other than by MOVPE.

Figure 3B:
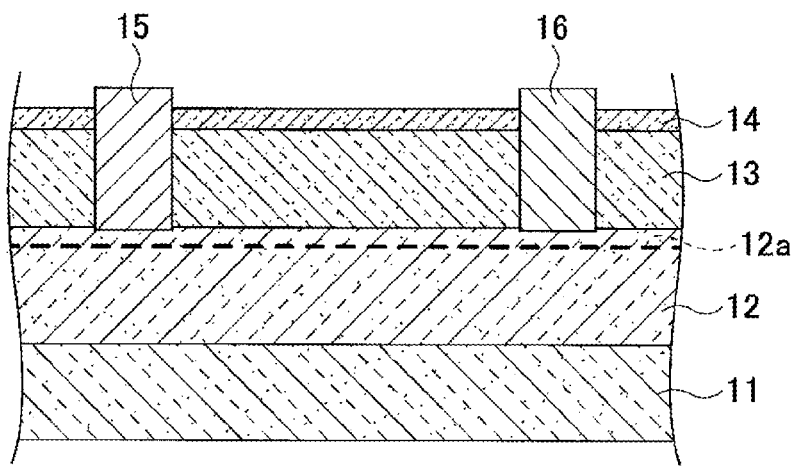

Next, as illustrated in FIG. 3B, a source electrode 15 and a drain electrode 16 may be formed. Specifically, a not-illustrated resist pattern having respective openings may be formed in regions, in which the source electrode 15 and the drain electrode 16 are formed, by applying a photoresist to a surface of the cap layer 14, and exposing and developing the photoresist on the surface of the cap layer 14 utilizing an exposure apparatus. Thereafter, the regions, in which the resist pattern is not formed, of the cap layer 14 and the electron supply layer 13 may be etched (removed) by dry etching such as a reactive ion etching (RIE) or the like, using chlorine-based gases until the surface of the electron channel layer 12 is exposed. The dry etching used may be carried out by introducing the chlorine-based gases in an amount approximately 30 sccm, setting the pressure inside the chamber at approximately 2 Pa, and applying RF power of 20 W. Thereafter, after having a metallic film formed of a Ta/Al layered film or the like deposited by vacuum deposition, the metallic film formed in the regions, in which the resist pattern is formed, may be lifted off to be removed together with the resist pattern. The source electrode 15 and the drain electrode 16 may thus be formed. Note that after the metallic film and the resist pattern have been lifted off, a heat treatment may be conducted at a temperature of 550° C., for example.

Figure 3C:
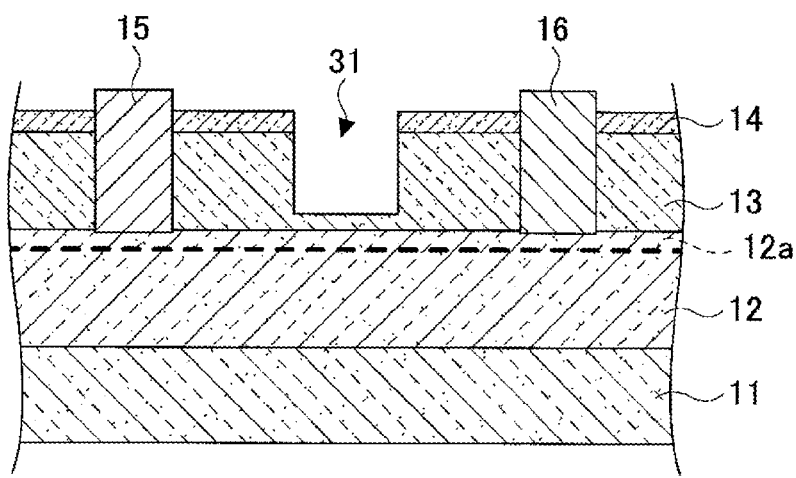

Next, as illustrated in FIG. 3C, an opening 31 may be formed. Specifically, a not-illustrated resist pattern having an opening may be formed in a region, in which the opening 31 is formed, by applying a photoresist to a surface of the cap layer 14, and exposing and developing the photoresist on the surface of the cap layer 14 utilizing the exposure apparatus. Thereafter, part of the regions, in which the resist pattern is not formed, of the cap layer 14 and the electron supply layer 13 are etched (removed) by dry etching such as a reactive ion etching (RIE) or the like by introducing chlorine-based gases. The opening 31 may thus be formed. Note that the resist pattern may be removed thereafter.

Figure 4A:
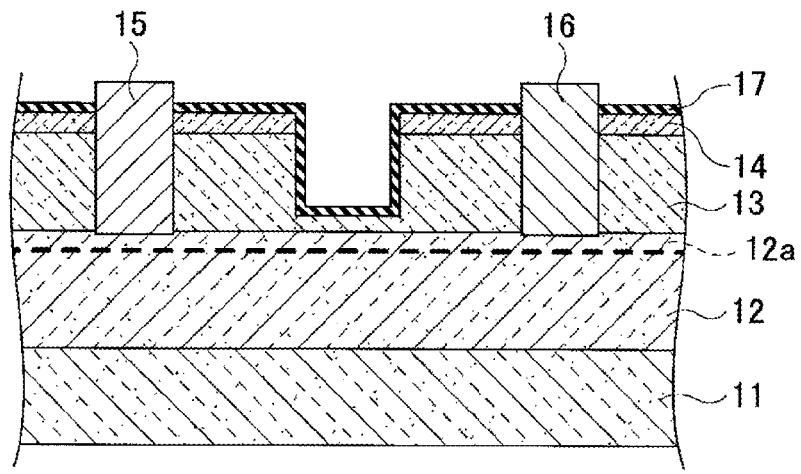
FIGS. 4A to 4C are cross sectional views illustrating a second fabrication process of the semiconductor device in the first embodiment.

Next, as illustrated in FIG. 4A, an insulating film 17 may be formed on an inner surface of the opening 31 and on the cap layer 14. The insulating film 17 may be formed by the ALD or the like to deposit aluminum oxide, tantalum oxide, hafnium oxide, and the like in the thickness range of 5 to 100 nm. Specifically, in the method of fabricating the semiconductor device according to the first embodiment, aluminum oxide may be deposited in the thickness of 20 nm by the ALD or the like.

Figure 4B:
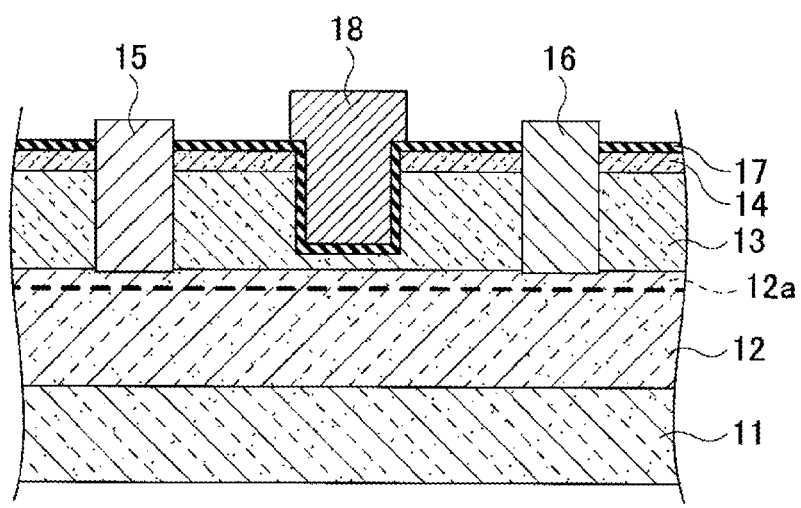

Next, as illustrated in FIG. 4B, a gate electrode 18 may be formed. Specifically, a not-illustrated under layer resist (e.g., product name: PMGI produced by MicroChem Corp.) and a not-illustrated upper layer resist (e.g., product name: PFI32-A8 produced by Sumitomo Chemical Co. Ltd.) may be formed on the insulating film 17 by spin coating. Thereafter, the upper layer resist may be exposed by the exposure apparatus, such that an opening having approximately 0.8 μm is formed in a region of the upper layer resist including a part forming the opening 31. Next, the under layer resist may be wet-etched with alkali developer using the upper layer resist as a mask. Thereafter, after having the metallic films (Ni: the film thickness of approximately 10 nm; Au: the film thickness of approximately 300 nm) to be deposited on the entire surface by vacuum deposition, the under layer resist and the upper layer resist may be lifted off utilizing a heated organic solvent to be removed together with the metallic films deposited on the upper layer resist. As a result, the gate electrode 18 formed of Ni/Au may be formed via the insulator 17 within the opening 31.

Figure 4C:
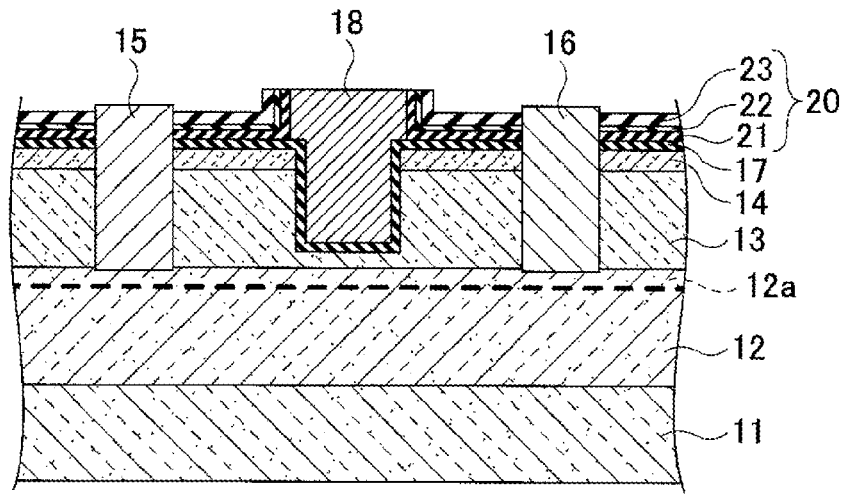

Next, as illustrated in FIG. 4C, a first insulating protective film 21, an amorphous carbon film 22, and a second insulating protective film 23 may be formed on the insulating film 17 in a layered manner to thereby form a protective film 20. The first insulating protective film 21 may be formed by the ALD depositing an aluminum oxide film having a thickness of 50 nm. The amorphous carbon film 22 may be deposited in a thickness of approximately 10 nm by FCA under the condition of an arc current of 70 A and an arc voltage of 26 V, using graphite targets as raw materials. The second insulating protective film 23 may be formed by the plasma CVD depositing a silicon nitride film having a thickness of approximately 350 nm under the condition of RF power of 60 W, using $SiH_4$, $N_2$, and $NH_3$ as raw material gases. Thereafter, an AlGan/Gan field effective transistor (FET) may be formed after processes such as forming contact holes, wiring, and the like have been carried out.

As described above, a transistor serving as the semiconductor device in the first embodiment may be made as a result.

Figure 5:
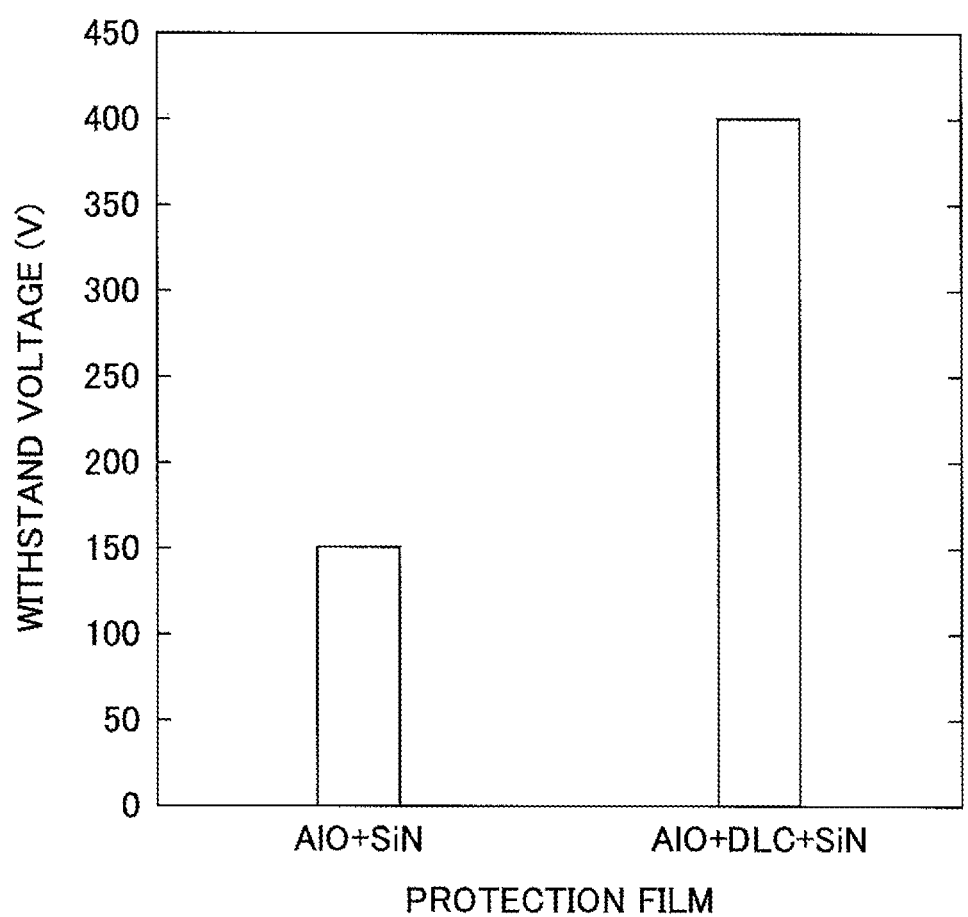
FIG. 5 is a diagram for explaining a withstand voltage of the semiconductor device.

FIG. 5 illustrates a withstand voltage of the transistor serving as the semiconductor device in the first embodiment and a withstand voltage of a transistor, serving as a comparative example, having a layered film composed of an aluminum oxide film and a silicon nitride film as a protective film. In the transistor having the layered film composed of an aluminum oxide film and a silicon nitride film as a protective film, device breakdown was observed by applying a voltage of approximately 150 V to an interval between the source electrode and the drain electrode. By contrast, in the transistor according to the first embodiment, device breakdown was not observed by applying a voltage of 400 V or above to an interval between the source electrode and the drain electrode. Thus, the withstand voltage may be improved in the semiconductor device according to the first embodiment.

Deposition of Amorphous Carbon Film

Figure 6:
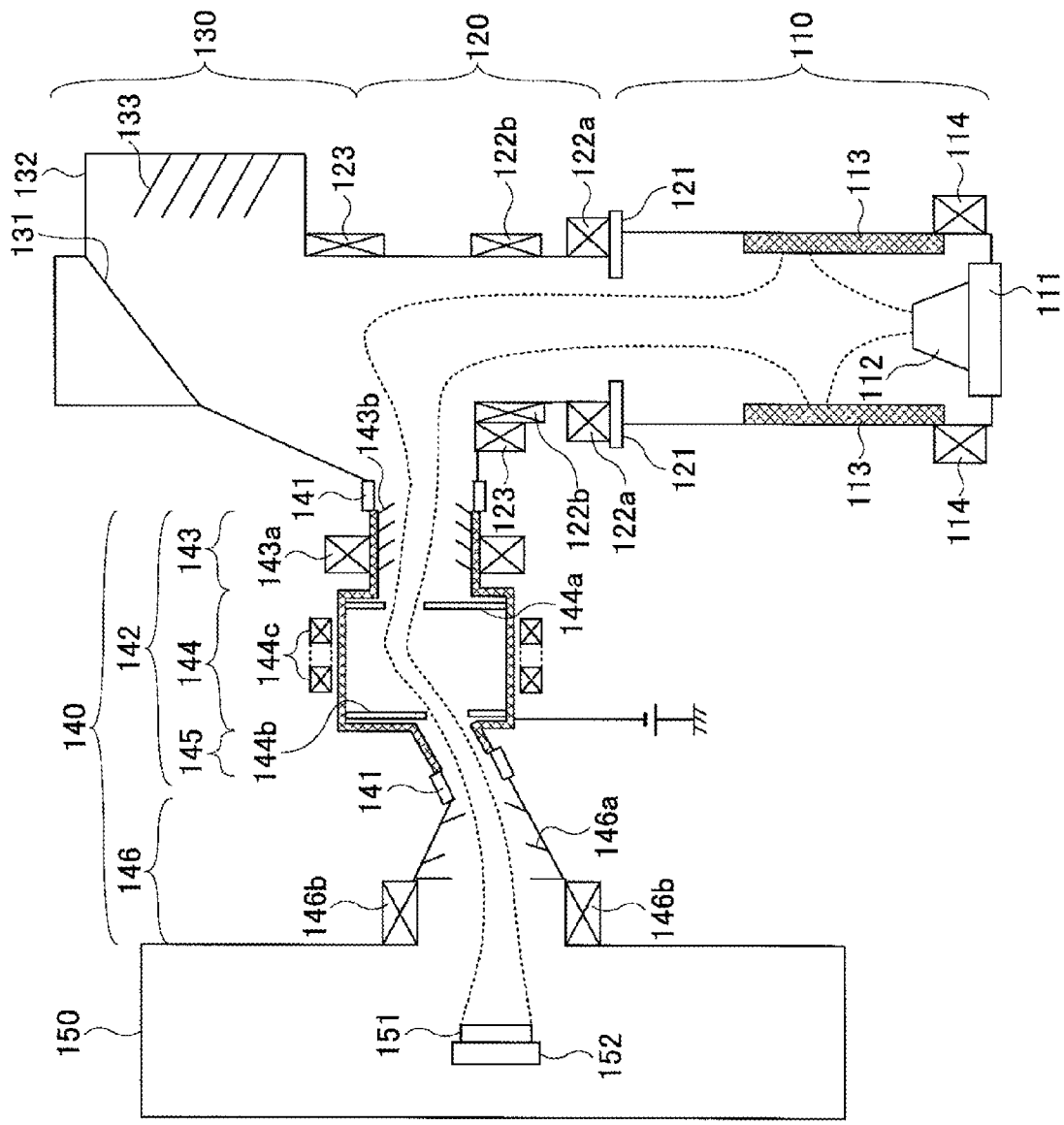
FIG. 6 is a diagram illustrating a structure of a filtered cathodic arc (FCA) deposition apparatus.

Next, the FCA for depositing the amorphous carbon film will be illustrated. FIG. 6 illustrates a structure of an FCA deposition apparatus utilized in the FCA. The FCA deposition apparatus includes a plasma generator 110, a plasma separator 120, a particle trap 130, a plasma transporter 140, and a deposition chamber 150. The plasma generator 110, the plasma separator 120, and the particle trap 130 may each have a tabular form, and may be coupled in this order. The plasma transporter 140 may also have a tabular form. A first end of the plasma transporter 140 may be connected to the plasma separator 120 in an approximately vertical manner and a second end of the plasma transporter 140 may be connected to the deposition chamber 150. The deposition chamber 150 includes a stage 152 for setting a substrate 151 and the like that are subject to deposition.

An insulator plate 111 may be disposed at a lower end of a housing of the plasma generator 110, and graphite serving as a target (cathode) 112 is disposed on the insulator plate 111. In addition, a cathode coil 114 may be disposed in an outer periphery of the lower end of the housing of the plasma generator 110, and an anode 113 may be disposed on an inner wall surface of the housing. In depositing the amorphous carbon film, a predetermined voltage may be applied from a not-illustrated power supply to an interval between the target 112 and the anode 113 to generate arc discharge, such that plasma may be generated in an upward direction of the target 112. A predetermined current may be supplied from a not-illustrated other power supply to the cathode coil 114 to generate magnetic fields for stabilizing the arc discharge. The carbon forming the target 112 of the graphite may be evaporated due to the arc discharge, and the evaporated carbon may be supplied into the plasma as ions for a deposition material.

An insulator ring 121 may be disposed at a boundary part between the plasma generator 110 and the plasma separator 120 such that the housing of the plasma generator 110 and a housing of the plasma separator 120 are electrically separated by the insulator ring 121. Guide coils 122a and 122b may be disposed in an outer periphery of the housing of the plasma separator 120. The guide coils 122a and 122b are configured to generate magnetic fields for transporting plasma generated in the plasma generator 110 in a predetermined direction while converging the plasma in a central part of the housing of the plasma separator 120. Further, an oblique magnetic field generator coil 123 configured to generate a magnetic field to bend a plasma travelling direction into an approximately vertical manner may be disposed in the vicinity of the connecting part between the plasma separator 120 and the plasma transporter 140.

Particles generated in the plasma generator 110 travel straight without being affected by the magnetic field generated in the plasma separator 120 to enter the particle trap 130. A reflector 131 configured to reflect the particles in a transverse direction, and a particle trap part 132 configured to trap the particles reflected off the reflector 131 may be disposed on an upper end part of the particle trap part 130. A plurality of fins 133 may be disposed obliquely with respect to an inner part of a housing of the particle trap part 132. The particles having entered the particle trap part 132 may be reflected by these fins 133 numerous times, such that the particles may lose their kinetic energy. Hence, the particles may eventually be trapped by being attached to the fins 133 or the wall surface of the housing of the particle trap part 132.

The plasma separator 120 may separate plasma from particles, and the separated plasma may enter the plasma transporter 140. The plasma transporter 140 includes a negative voltage application part 142, and a communication part 146. Insulator rings 141 are disposed at an interval between the negative voltage application part 142 and the plasma separator 120, and at an interval between the negative voltage application part 142 and the communication part 146, respectively. The disposing the insulator rings 141 at the respective intervals may electrically separate the plasma separator 120 from the negative voltage application part 142, and may similarly electrically separate the plasma separator 120 from the communication part 146.

The negative voltage application part 142 further includes an entrance part 143 on the plasma separator 120 side, an outlet part 145 on the communication part 146 side, and a middle part 144 between the entrance part 143 and the outlet part 145. A guide coil 143a configured to move plasma toward the deposition chamber 150 side while converging the plasma may be disposed at an outer periphery of the entrance part 143. The entrance part 143 may further include a plurality of fins 143b configured to trap the particles entering the entrance part 143, and the fins 143b may be disposed obliquely with respect to an inner surface of a housing of the entrance part 143.

Apertures 144a and 144b having openings configured to form a plasma channel may be disposed at the entrance part 143 and the outlet part 145 of the middle part 144, respectively. In addition, a guide coil 144c configured to generate a magnetic field for bending a plasma travelling direction may be disposed at an outer periphery of the middle part 144.

The communication part 146 may be formed such that a diameter of the communication part 146 gradually widens from the negative voltage application part 142 side to the deposition chamber 150 side. A plurality of fins 146a may be disposed inside the communication part 146, and a guide coil 146b configured to move plasma toward the deposition chamber 150 while converging the plasma may be disposed at an outer periphery of a boundary part between the communication part 146 and the deposition chamber 150 side.

In the filtered cathodic arc (FCA) deposition apparatus illustrated in FIG. 6, the plasma generator 110 may induce arc discharge to generate plasma containing carbon ions, and the generated plasma may reach the substrate 151 and the like while allowing the oblique magnetic field generator coil 123 or the like to remove components such as the particles. As a result, an amorphous carbon film may be deposited on the substrate 151 and the like.

Second Embodiment

Next, a semiconductor device according to a second embodiment is described. The semiconductor device according to the second embodiment may include a structure having an amorphous carbon film 221 and an insulating protective film 222 formed, as a protective film 220, on an insulating film 17.

Figure 7:
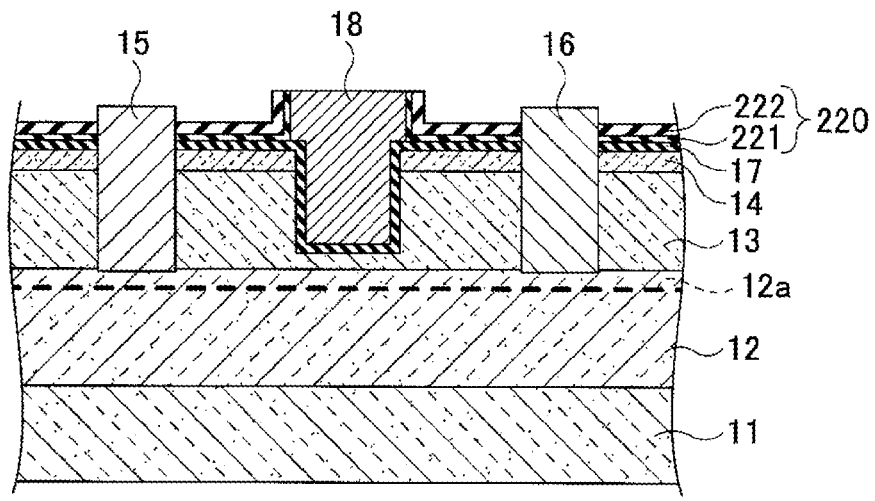
FIG. 7 is a cross sectional view illustrating a structure of a semiconductor device in a second embodiment.

Specifically, as illustrated in FIG. 7, the semiconductor device in the second embodiment may be called a high electron mobility transistor (HEMT). The HEMT may include an electron channel layer 12, an electron supply layer 13, and a cap layer 14 that are epitaxially grown on a substrate 11 formed of a semiconductor and the like in a layered manner. Further, a source electrode 15 and a drain electrode 16 may be connected to the electron channel layer 12, and a gate electrode 18 may be formed via the insulating film 17 within an opening that is formed by eliminating parts of the cap layer 14 and the electron supply layer 13. The insulating film 17 may further be formed on the cap layer 14, and the amorphous carbon film 221 and the insulating protective film 222 may be formed as the protective film 220 on the insulating film 17. The insulating protective film 222 may be formed of a silicon nitride (SiN) deposited by the plasma CVD or the like. The amorphous carbon film 221 may be similar to the amorphous carbon film 22 in the first embodiment, which may have carbon as a major component.

Next, a method of fabricating a semiconductor device according to the second embodiment is described. Processes in the method of fabricating the semiconductor device in the second embodiment may be similar to those illustrated in FIGS. 3A to 3C, and FIGS. 4A and 4B in the method of fabricating the semiconductor device in the first embodiment. In a process subsequent to the process illustrated in FIG. 4B, an amorphous carbon film 221 and an insulating protective film 222 may be formed. Specifically, the amorphous carbon film 221 may be deposited in the thickness of approximately 10 nm by FCA under the condition of an arc current of 70 A and an arc voltage of 26 V, using graphite targets as raw materials. The insulating protective film 222 may be formed by the plasma CVD depositing a silicon nitride film having a thickness of approximately 350 nm under the condition of RF power of 60 W, using $SiH_4$, $N_2$, and $NH_3$ as raw material gases.

In the method of fabricating the semiconductor device according to the second embodiment, little plasma damage may affect an insulating film 17 while forming the amorphous carbon film 221. In addition, in the method of fabricating the semiconductor device according to the second embodiment, a gas containing a hydrogen component will not be used for forming the amorphous carbon film 221. Hence, an aluminum oxide film of a surface of the insulating film 17 will not be reduced with hydrogen, which may inhibit a metal-rich layer from being formed on the surface of the insulating film 17. With the above-described factors, the withstand voltage may be increased. Note that when a function serving as the protective film may be acquired by forming an amorphous carbon film alone, forming of the insulating protective film 222 may be unnecessary. Hence, the semiconductor device fabricated by the method in the second embodiment may have a structure formed with the amorphous carbon film alone.

Note that methods of the semiconductor device in the second embodiment excluding those described above may be similar to the method in the first embodiment.

Third Embodiment

Figure 8:
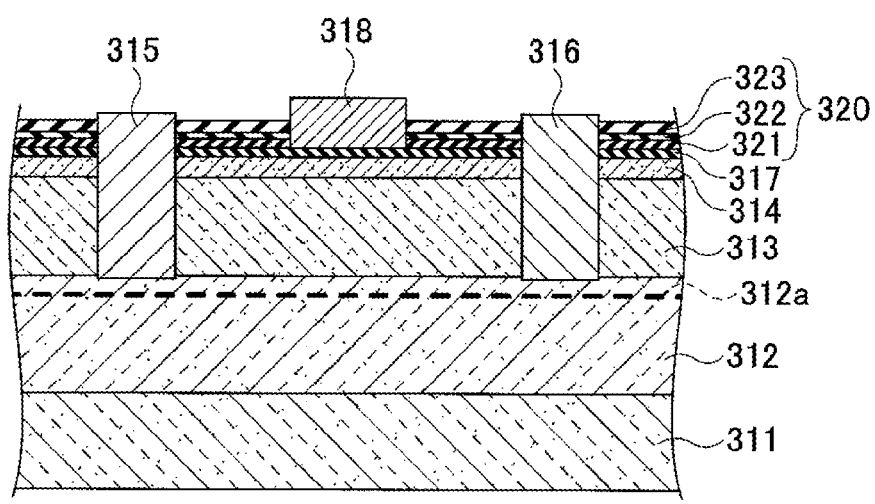
FIG. 8 is a cross sectional view illustrating a structure of a semiconductor device in a third embodiment.

Next, a semiconductor device according to a third embodiment is described. FIG. 8 illustrates a structure of a semiconductor device according to the third embodiment. The semiconductor device in the third embodiment may include an electron channel layer 312, an electron supply layer 313, and a cap layer 314 that are epitaxially grown on a substrate 311 formed of a semiconductor and the like in a layered manner. Further, a source electrode 315 and a drain electrode 316 may be connected to the electron channel layer 312, an insulating film 317 may be formed on the cap layer 314, and a gate electrode 318 may be formed on the insulating film 317. In addition, a first insulating protective film 321, an amorphous carbon film 322, and a second insulating protective film 323 may be formed as a protective film 320 on an exposed part of the insulating film 317.

The substrate 311 may be formed of a silicon carbide (SiC) substrate, a sapphire ($Al_2O_3$) substrate, or the like. The electron channel layer 312 serving as a first semiconductor layer may be made of i-GaN, the electron supply layer 313 serving as a second semiconductor layer may be made of n-AlGaN, and the cap layer 314 serving as a third semiconductor layer may be made of n-GaN. Note that the above-described structure may form a two-dimensional electron gas (2DEG) 312a in an interface of the electron channel layer 312 between the electron channel layer 312 and the electron supply layer 313 in the vicinity of the electron supply layer 313. In addition, the source electrode 315, the drain electrode 316, and the gate electrode 318 may be formed of metallic materials, and the insulating film 317 may be formed by a plasma atomic layer deposition (ALD) that deposits an aluminum oxide ($Al_2O_3$) film. Further, the first insulating protective film 321 may be formed of an aluminum oxide film, and the second insulating protective film 323 may be formed of a silicon nitride (SiN) film. The amorphous carbon film 322 may be similar to the amorphous carbon film 22 in the first embodiment.

Method of Fabricating Semiconductor Device

Next, a method of fabricating a semiconductor device according to a third embodiment is described with reference to FIGS. 9A to 9C, and FIGS. 10A and 10B.

Figure 9A:
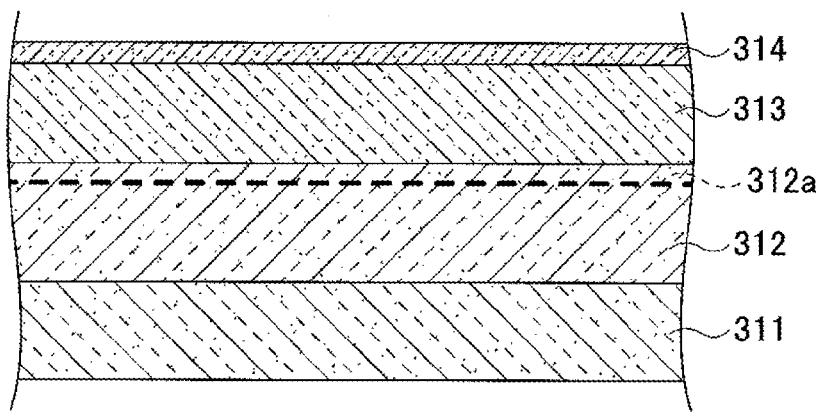
FIGS. 9A to 9C are cross sectional views illustrating a first fabrication process of the semiconductor device in the third embodiment.

As illustrated in FIG. 9A, a not-illustrated nucleation layer is formed on a substrate 311, and semiconductor layers including an electron channel layer 312, an electron supply layer 313, a cap layer 314, and the like may epitaxially be grown on the substrate 311 by metal-organic vapor phase epitaxy (MOVPE) or the like, thereby forming the semiconductor device.

The substrate 311 may be formed of a silicon carbide (SiC) substrate or a sapphire ($Al_2O_3$) substrate. The not-illustrated nucleation layer may be formed of undoped i-Aln having a thickness of 0.1 μm, for example. The electron channel layer 312 may be formed of i-GaN having a thickness of 3.0 μm, and the electron supply layer 313 may be formed of n-$Al_{0.25}Ga_{0.75}N$ having a thickness of 20 nm. Further, the cap layer 314 may be formed of n-GaN having a thickness of 5 nm.

Figure 9B:
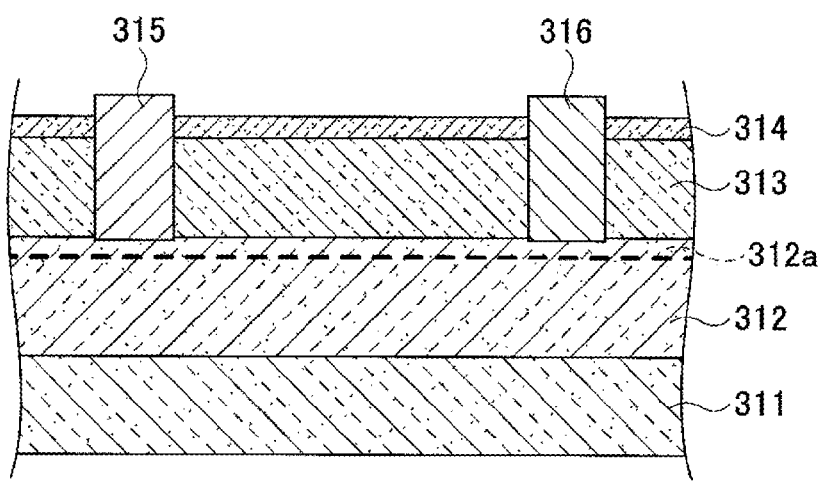

Next, as illustrated in FIG. 9B, a source electrode 315 and a drain electrode 316 may be formed. Specifically, a not-illustrated resist pattern having respective openings may be formed in regions, in which the source electrode 315 and the drain electrode 316 are formed, by applying a photoresist to a surface of the cap layer 314, and exposing and developing the photoresist on the surface of the cap layer 314 utilizing an exposure apparatus. Thereafter, the regions, in which the resist pattern is not formed, of the cap layer 314 and the electron supply layer 313 are etched (removed) by dry etching such as a reactive ion etching (RIE) or the like using chlorine-based gases until the surface of the electron channel layer 312 is exposed. Thereafter, after having a metallic film formed of a Ta/Al layered film or the like deposited by vacuum deposition, the metallic film formed in the regions, in which the resist pattern is formed, may be lifted off to be removed together with the resist pattern. The source electrode 315 and the drain electrode 316 may thus be formed. Note that after the metallic film and the resist pattern have been lifted off, a heat treatment may be conducted at a temperature of 550° C., for example.

Figure 9C:
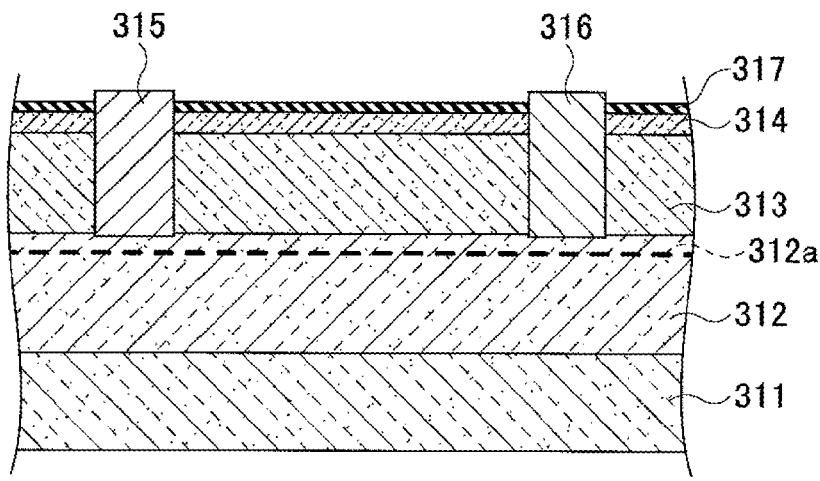

Next, as illustrated in FIG. 9C, an insulating film 317 may be formed on the cap layer 314. The insulating film 317 may be formed by the ALD or the like to deposit aluminium oxide, tantalum oxide, hafnium oxide, and the like in the thickness range of 5 to 100 nm. Specifically, in the method of fabricating the semiconductor device according to the third embodiment, aluminum oxide may be deposited in the thickness of 20 nm by the ALD or the like.

Figure 10A:
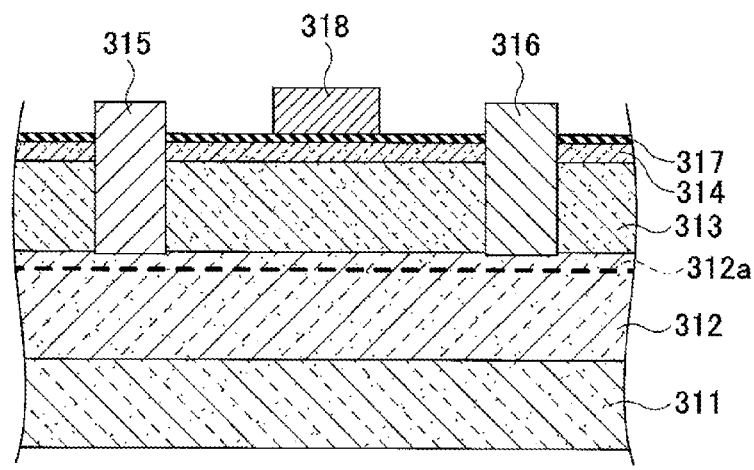
FIGS. 10A and 10B are cross sectional views illustrating a second fabrication process of the semiconductor device in the third embodiment.

Next, as illustrated in FIG. 10A, a gate electrode 318 may be formed. Specifically, a not-illustrated resist pattern having an opening may be formed in a region, in which the gate electrode 318 is formed, by applying a photoresist to a surface of the insulating film 317, and exposing and developing the photoresist on the surface of the insulating film 317 utilizing the exposure apparatus. Thereafter, after having the metallic films (Ni: the film thickness of approximately 10 nm; Au: the film thickness of approximately 300 nm) deposited on the entire surface by vacuum deposition, the metallic films formed on the resist pattern may be lifted off by being impregnated with an organic solvent to be removed together with the resist pattern. As a result, the gate electrode 318 formed of Ni/Au may be formed on the insulating film 317.

Figure 10B:
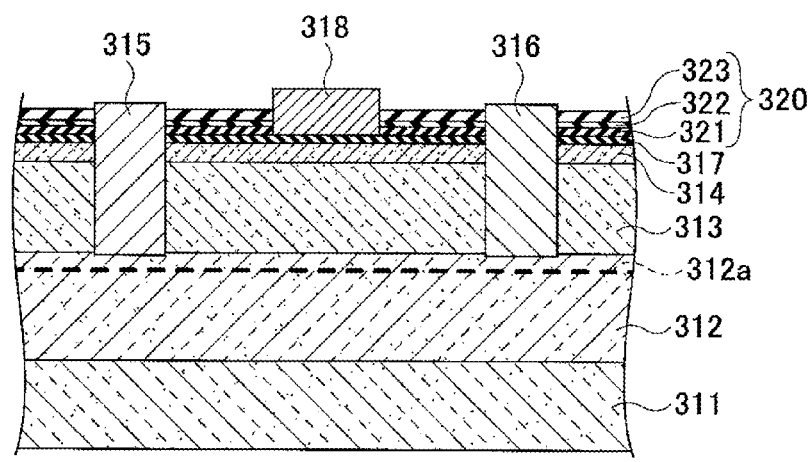

Next, as illustrated in FIG. 10B, a first insulating protective film 321, an amorphous carbon film 322, and a second insulating protective film 323 may be formed on the insulating film 317 in a layered manner to thereby form a protective film 320. The first insulating protective film 321 may be formed by the ALD depositing an aluminum oxide film having a thickness of 50 nm. The amorphous carbon film 322 may be deposited in the thickness of approximately 10 nm by the FCA under the condition of an arc current of 70 A and an arc voltage of 26 V, using graphite targets as raw materials. The second insulating protective film 323 may be formed by the plasma CVD depositing a silicon nitride film having a thickness of approximately 350 nm under the condition of RF power of 60 W, using $SiH_4$, $N_2$, and $NH_3$ as raw material gases.

As described above, a transistor serving as the semiconductor device according to the third embodiment may be made as a result.

According to the semiconductor device and the method of fabricating the semiconductor device in the disclosed embodiments, it may be possible to provide a semiconductor device such as a transistor having the insulating film formed between the gate electrode and the semiconductor layer, which may be capable of exhibitiing a sufficient withstand voltage even if the semiconductor device has an insulating film as a protective film.

Note that methods of the semiconductor device in the second embodiment excluding those described above may be similar to the method in the first embodiment, and the structure of the protective film illustrated in the second embodiment may also be applied to the structure of the protective film in the third embodiment.

Although the embodiments are numbered with, for example, "first," "second," or "third," these numbers do not specify priorities of the embodiments. Numerous other variations and modifications may be made, which is apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor layer formed on a substrate;
   a second semiconductor layer formed on the first semiconductor layer;
   a source electrode and a drain electrode in contact with the first semiconductor layer or the second semiconductor layer;
   an opening formed in the second semiconductor layer;
   an insulating film formed on an inner surface of the opening formed in the second semiconductor layer and above the second semiconductor layer;
   a gate electrode formed in the opening via the insulating film; and
   a protective film formed on the insulating film and including an amorphous film containing carbon as a major component.

2. The semiconductor device as claimed in claim 1,
   wherein the protective film includes the amorphous film and an insulating protective film,
   wherein the amorphous film is formed on the insulating film, and
   wherein the insulating protective film is formed on the amorphous film.

3. The semiconductor device as claimed in claim 1,
   wherein the protective film includes the amorphous film, a first insulating protective film, and a second insulating protective film,
   wherein the first insulating protective film is formed on the insulating film,
   wherein the amorphous film is formed on the first insulating protective film, and
   wherein the second insulating protective film is formed on the amorphous film.

4. The semiconductor device as claimed in claim 1, wherein a thickness range of the amorphous film is 1 nm or more and 30 nm or less.

5. The semiconductor device as claimed in claim 1, wherein a ratio of carbon-carbon bonding in the amorphous film is represented by sp2≤sp3.

6. The semiconductor device as claimed in claim 1, wherein a density range of the amorphous film is 2.7 $g/cm^3$ or higher and 3.56 $g/cm^3$ or less.

7. The semiconductor device as claimed in claim 1, wherein the insulating film is made of aluminum oxide.

8. The semiconductor device as claimed in claim 1, wherein the first semiconductor layer includes gallium nitride (GaN).

9. The semiconductor device as claimed in claim 1, wherein the second semiconductor layer includes aluminum gallium nitride (AlGaN).

10. The semiconductor device as claimed in claim 1, further comprising:
    a third semiconductor layer disposed between the second semiconductor layer and the insulating film, wherein the third semiconductor layer includes n-type gallium nitride (n-GaN).

11. The semiconductor device as claimed in claim 1, the semiconductor device being configured to function as a high electron mobility transistor (HEMT).

12. The semiconductor device as claimed in claim 2, wherein the insulating protective film includes silicon nitride.

13. The semiconductor device as claimed in claim 3, wherein the second insulating protective film includes silicon nitride.

14. The semiconductor device as claimed in claim 3, wherein the first insulating protective film is made of a material the same as that of the insulating film.

15. A semiconductor device comprising:
- a first semiconductor layer formed on a substrate;
- a second semiconductor layer formed on the first semiconductor layer;
- a source electrode and a drain electrode in contact with the first semiconductor layer or the second semiconductor layer;
- an insulating film formed above the second semiconductor layer;
- a gate electrode formed on the insulator; and
- a protective film formed on the insulating film and including an amorphous film containing carbon as a major component.

16. A method of fabricating a semiconductor device, comprising:
- forming a first semiconductor layer on a substrate and a second semiconductor layer on the first semiconductor layer;
- forming a source electrode and a drain electrode in contact with the first semiconductor layer or the second semiconductor layer;
- forming an opening in the second semiconductor layer;
- forming an insulating film on an inner surface of the opening formed in the second semiconductor layer and above the second semiconductor layer;
- forming a gate electrode in the opening via the insulating film; and
- forming a protective film including an amorphous film containing carbon as a major component on an exposed part of the insulating film.

17. The method as claimed in claim 16,
wherein the forming the protective film includes
forming the amorphous film on the insulating film, and
forming an insulating protective film on the amorphous film.

18. The method as claimed in claim 16,
wherein the forming the protective film includes
forming a first insulating protective film on the insulating film,
forming the amorphous film on the first insulating protective film, and
forming a second insulating protective film on the amorphous film.

19. The method as claimed in claim 16,
wherein the amorphous film is formed by filtered cathodic arc deposition.

20. A method of fabricating a semiconductor device, comprising:
- forming a first semiconductor layer on a substrate and a second semiconductor layer on the first semiconductor layer;
- forming a source electrode and a drain electrode in contact with the first semiconductor layer or the second semiconductor layer;
- forming an insulating film above the second semiconductor layer;
- forming a gate electrode on a part of the insulating film; and
- forming a protective film including an amorphous film containing carbon as a major component on an exposed part of the insulating film.

* * * * *